(12) United States Patent
Barsky

(10) Patent No.: US 8,823,417 B2
(45) Date of Patent: Sep. 2, 2014

(54) COMBINATION AC/DC PEAK DETECTOR AND SIGNAL TYPE DISCRIMINATOR

(75) Inventor: Lev Michael Barsky, New York, NY (US)

(73) Assignee: Siemens Industry, Inc., Alpharetta, GA (US)

( * ) Notice: Subject to any disclaimer, the term of this patent is extended or adjusted under 35 U.S.C. 154(b) by 95 days.

(21) Appl. No.: 12/499,631

(22) Filed: Jul. 8, 2009

(65) Prior Publication Data

US 2010/0007384 A1    Jan. 14, 2010

Related U.S. Application Data

(60) Provisional application No. 61/079,264, filed on Jul. 9, 2008.

(51) Int. Cl.
*H03K 5/153* (2006.01)
*H03K 5/1532* (2006.01)
*G01R 19/04* (2006.01)

(52) U.S. Cl.
CPC ............ *H03K 5/1532* (2013.01); *G01R 19/04* (2013.01)
USPC .......................................................... 327/58

(58) Field of Classification Search
USPC ........... 327/63, 65, 67, 68, 69, 70, 72, 73, 74, 327/142, 143, 198
See application file for complete search history.

(56) References Cited

U.S. PATENT DOCUMENTS

| 6,292,058 | B1 * | 9/2001 | Ide et al. ....................... 330/279 |
| 6,704,182 | B2 * | 3/2004 | Bruckmann et al. ......... 361/91.1 |
| 6,825,721 | B2 * | 11/2004 | Sanchez et al. ............... 330/253 |
| 7,005,883 | B2 * | 2/2006 | Liao et al. ...................... 324/771 |
| 7,683,676 | B2 * | 3/2010 | Ide .................................... 327/58 |
| 7,715,501 | B2 * | 5/2010 | Stojanovic et al. ........... 375/340 |
| 2002/0071230 | A1 | 6/2002 | Colclaser et al. ............... 361/56 |
| 2006/0020307 | A1 * | 1/2006 | Davis et al. ..................... 607/61 |
| 2007/0126480 | A1 | 6/2007 | McQuirk et al. |

FOREIGN PATENT DOCUMENTS

| CN | 1821793 A | 8/2006 | |
| EP | 1 322 018 | 6/2003 | ............... H02H 3/33 |
| JP | 10 332748 | 12/1998 | ............. G01R 19/04 |
| JP | 10332748 A | 12/1998 | |

OTHER PUBLICATIONS

International Search Report dated Oct. 30, 2009 for Application No. PCT/US2009/049994.
Written Opinion of the International Searching Authority dated Oct. 30, 2009 for Application No. PCT/US2009/049994.
Chinese Search Report for CN Application No. 200980134963.8.
Chinese Office Action dated Jan. 17, 2013, for application No. 20.

\* cited by examiner

*Primary Examiner* — Sibin Chen

(57) ABSTRACT

A device and method for current detecting and discriminating is disclosed. The device includes a differential receiver configured to receive a current input, a positive-side Schmitt trigger in communication with the input stage, wherein the positive-side Schmitt trigger is configured to receive an output provided by the input stage, and wherein the positive-side Schmitt trigger is configured to create a positive-side Schmitt trigger output representative of the current input, and a negative-side Schmitt trigger in communication with the input stage, wherein the negative-side Schmitt trigger is configured to receive the output provided by the input stage, and wherein the negative-side Schmitt trigger is configured to create a negative-side Schmitt trigger output representative of the current input.

18 Claims, 2 Drawing Sheets

COMBINATION AC/DC PEAK DETECTOR AND SIGNAL TYPE DISCRIMINATOR

PRIORITY CLAIM

This patent document claims the priority benefit provided under 35 U.S.C. §119(e) to U.S. provisional patent application Ser. No. 61/079,264, filed on Jul. 9, 2008. The content of this provisional patent application is incorporated herein by reference for all purposes.

BACKGROUND

Methods, systems, circuits and devices for signal detection and discrimination are typically complex which increases the setup costs, the maintenance costs as well as the overall design costs of these known systems and methods. The signals inputted or otherwise provided to these known systems and method may include an AC signal or current, a DC signal or current or any combination of AC and DC signals or currents. For example, a fire alarm system may include a fire alarm amplifier configured to generate a supervised output. The supervised output may, in turn, be configured to utilize an AC signal or current to drive one or more fire alarm speakers. The supervised output may be further configured to utilize a DC signal or current during a standby condition. Thus, any device, card or automation component receiving the supervised output may be required to receive both incoming AC and DC signals or currents and discriminate therebetween.

SUMMARY

This patent and the disclosure provided herein relates to methods, systems, circuits and devices for detecting and discriminating between received incoming AC and DC signals or currents. In particular, the disclosed embodiments provides for a single device or circuit configured to detect and differentiate between an AC signal, a positive DC signal and a negative DC signal. Thus, incoming or received signals are monitored and evaluated on both the positive and negative sides of the received or inputted waveform.

In one embodiment, a device for current detecting and discriminating is disclosed. The device includes an input stage configured to receive a current input, a positive-side peak detector in communication with the input stage, wherein the positive-side peak detector is configured to receive an output provided by the input stage, and wherein the positive-side peak detector is configured to create a positive-side peak detector output representative of the current input, and a negative-side peak detector in communication with the input stage, wherein the negative-side peak detector is configured to receive the output provided by the input stage, and wherein the negative-side peak detector is configured to create a negative-side peak detector output representative of the current input.

In another embodiment, a device for current detecting and discriminating is disclosed. The device includes a differential receiver configured to receive a current input, a positive-side Schmitt trigger in communication with the input stage, wherein the positive-side Schmitt trigger is configured to receive an output provided by the input stage, and wherein the positive-side Schmitt trigger is configured to create a positive-side Schmitt trigger output representative of the current input, and a negative-side Schmitt trigger in communication with the input stage, wherein the negative-side Schmitt trigger is configured to receive the output provided by the input stage, and wherein the negative-side Schmitt trigger is configured to create a negative-side Schmitt trigger output representative of the current input.

Other embodiments are disclosed, and each of the embodiments can be used alone or together in combination. Additional features and advantages of the disclosed embodiments are described in, and will be apparent from, the following Detailed Description and the figures.

DETAILED DESCRIPTION

This patent and the disclosure provided herein relates to methods, systems, circuits and devices for detecting and discriminating between received incoming AC and DC signals or currents. In particular, the disclosed embodiments provides for a single device or circuit configured to detect and differentiate between an AC signal, a positive DC signal and a negative DC signal. Thus, incoming or received signals are monitored and evaluated on both the positive and negative sides of the received or inputted waveform.

Figure 1:
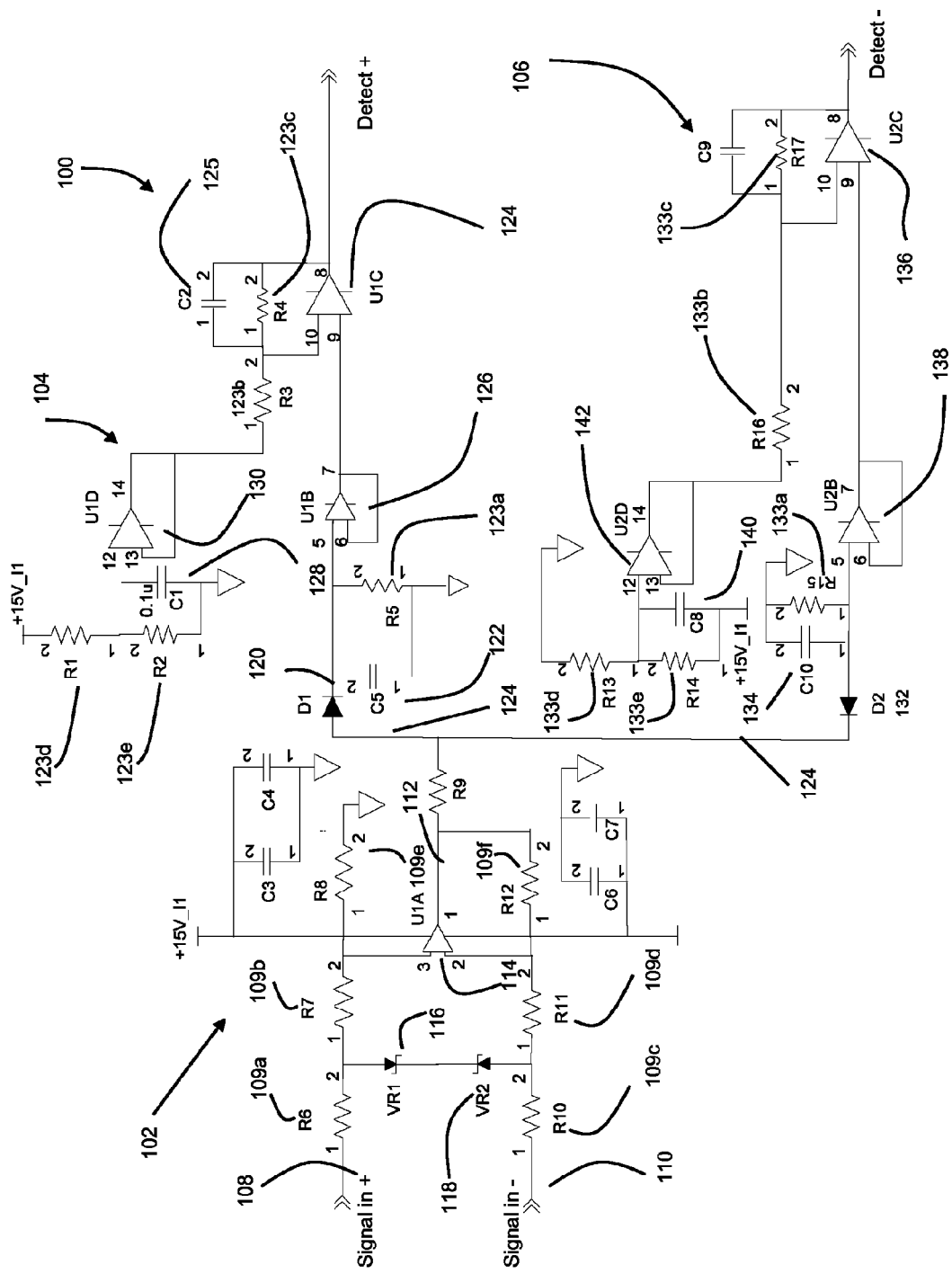
FIG. 1 illustrates an embodiment of a detection and discrimination circuit configured according to the disclosure provided herein.

FIG. 1 illustrates an exemplary circuit 100 configured to detect the presence of a signal and determine whether the detected signal is an AC or DC signal. The exemplary circuit 100 is further configured to determine the polarity of any detected or received incoming signal. The exemplary circuit 100 may be utilized to replace conventional circuits or devices, which utilize separate circuits to detect each kind or type of received signal. The exemplary circuit 100 may be incorporated in any number of devices such as, for example, automation components, fire alarm system devices and any other device tasked or intended to detect and discriminate between received incoming AC and DC signals or currents.

The exemplary circuit 100 includes a receiving or input stage 102. The input stage 102 in this exemplary embodiment is a differential receiver configured to convert a differential input signal received via "Signal In +" (identified by reference numeral 108) and "Signal In −" (identified by reference numeral 110) into a single-ended signal (identified by reference numeral 112) utilized by the communicatively connected or coupled positive peak detector 104 and negative peak detector 106. The differential input or input stage 102 may be configured and/or replaced with other types of receiver or voltage buffers depending on the expected input signal provided via the inputs 108 and 110. The input stage 102 further includes resistors 109a (R6), 109b (R7), 109c (R10) and 109d (R11), 109e (R8) and 109f (R12) selected, sized and configured to define a differential operational amplifier topology with the op-amp 114 discussed below. The ratio of the resistors 109a (R6), 109b (R7), 109c (R10) and 109d (R11), as well as resistors 109e (R8) and 109f (R12) determine the gain or attenuation of the input stage 102. As used and described herein, the term "means for" is used to describe alternate embodiments, and configurations that may be utilized, integrated and/or contemplated with one or more elements disclosed herein. For example, a means for controlling the gain or attenuation may include any known configuration, ratio or arrangement of electrical components, may include any solid state circuitry and/or may include any computer generated or controlled signals, inputs or other voltage changes.

The exemplary input stage 102 shown in FIG. 1 is configured to provide a unity gain or gain of factor 1 (equivalent to 0 dB) with the expectation of speaker levels (25 VRMS and higher) audio signal on the input. For example, the value of resistor 109a (R6) should, in this embodiment, be equal to 109c (R10). Basically, without taking into account the effects of Zener diodes 116 (VR1) and 118 (VR2), the ratio of the resistors 109e/(109a+109b)=109f/(109c+109d) determines the gain of the system. With all six resistors 109a to 109f being the same value, the differential op-amp 114 (U1A) actually attenuates the incoming signal. The expectations of the input signal levels, the desired sensitivity, and the behavior of the cough delay is what should determine the gain settings.

The cough delay can preferably be made to be the same at all input signal levels, or variable depending on the signal level. In case of the former, signal 112 should ideally be railing (maximum or minimum output voltage) at all useful signal levels so that the accumulation capacitors 122 and 140 are always charged to the same level, resulting in a consistent discharge time through the bleeding resistors 123a and 133e. However, it is preferable to have the lowest gain necessary to detect those signals, because a high gain may result in false or inaccurate signal or noise detection. For example, 25 VRMS may be established as the lowest allowable speaker level, followed by 70V and 100V RMS. Assuming this circuit has to have a consistent cough delay while detecting a 25 VRMS AC signal and a ±8V DC signal, the gain factor should be in the neighborhood of three (3).

The exemplary input stage 102 further includes the pair of Zener diodes 116 (VR1) and 118 (VR2), respectively, arranged in cooperation with the resisters 109a (R6), 109b (R7), 109c (R10) and 109d (R11) to protect the operation amplifier (op-amp) U1A (identified by reference numeral 114). Zener diodes 116 (VR1) and 118 (VR2) are, in this exemplary embodiment, 9.1 V Zener diodes, arranged to protect the op-amp 114 from an overvoltage. The input stage 102 is in communication with the positive-side peak detector 104 and the negative-side peak detector 106

The positive-side peak detector 104 utilizes a diode 120 (D1) to charge a capacitor 122 (C5) to the highest positive-voltage value of an input signal 124 received from the input stage 102, while preventing a voltage discharge along any path other than resistor 123a (R5). The combination of values of capacitor 122 (C5) and resistor 123a (R5) arranged in parallel with each other determines the amount of time it takes capacitor 122 (C5) to discharge. This discharge time is also referred to as a cough delay. Alternatively, other means for controlling discharge time may include utilizing a physical (mechanical) or electronic switch to reset the positive-side peak detector 104 instead of, or in addition to, the discharge time or cough delay.

The positive-side peak detector 104 further includes a Schmitt trigger built around or upon an op-amp 124 (U1C) in cooperation with resistors 123b (R3) and 123c (R4). The Schmitt trigger is essentially a comparator circuit that positive feedback where the ratio of the resistors 123b (R3) and 123c (R4) determines the hysteresis. Capacitor 125 (C2) may be a "speed-up" capacitor used to accelerate the op-amp switching speed and avoid unwanted oscillations. The capacitor 125 (C2) can be omitted, but is recommended when using an op-amp-based Schmitt trigger. The hysteresis of a Schmitt triggers generally describes a pair of selectable or adjustable thresholds. When an input to the Schmitt trigger is above a first threshold, the Schmitt trigger provides a high output. When the input to the Schmitt trigger is below a second threshold, the Schmitt trigger maintains the value or magnitude of the input. In other words, when an input to a non-inverting Schmitt trigger is above the high threshold, the Schmitt trigger provides a high output. The output remains high until the input to the Schmitt trigger falls below the low threshold. The behavior of an inverting Schmitt trigger is the same with the exception of output levels, which are low for a high input, and high for a low input. The Schmitt trigger incorporated into the positive-side peak detector 104 may be an active low trigger such that a negative output signal or supply indicates the presence of a positive input signal. A comparator or active-high circuit may be utilized or substituted based on the desired behavior and part selection.

A voltage buffer 126 (U1B) protects and prevents the op-amp 124 (U1C) from interacting with the capacitor 122 (C5). In alternate embodiments, the voltage buffer 126 (U1B) may be removed depending on the precise topology of subsequent circuitry related to the op-amp 124 (U1C). The reference or output associated with the op-amp 124 (U1C) is provided or scaled by the ratio of resistors 123d (R1) and 123e (R2), while the capacitor 128 (C1) provides low-pass filtering. A voltage follower 130 (U1D) buffers or otherwise stores the reference or output associated with the op-amp 124 (U1C). This reference can be unbuffered (with care), unfiltered, or implemented in another way (i.e. off-the-shelf discrete voltage reference). The output provided by positive-side peak detector 104, "Detect +", is high (near the positive supply rail) for an inactive signal on the positive side (signal below threshold), and low (near the negative supply rail) for an active signal present on the positive side (signal above threshold).

The negative-side peak detector 106 may be a mirror image of the positive-side peak detector 104. In other words, utilizes a diode 132 (D2) to charge a capacitor 134 (C10) to the largest negative voltage value of the input signal 124 received from the input stage 102, while preventing a voltage discharge along any path other than resistor 133a (R15). The combination of values of the capacitor 134 (C10) and the resistor 133a (R15) arranged in parallel with each other determines the amount of time it takes capacitor 134 (C10) to discharge or cough delay. As previously discussed other means for controlling discharge time may include utilizing a physical (mechanical) or electronic switch to reset.

The negative-side peak detector 106 further includes a Schmitt trigger built around or upon an op-amp 136 (U2C) in cooperation with resistors 133b (R16) and 133c (R17). The ratio of the resistors 133b (R16) and 133c (R7) determines an amount of amount of hysteresis. The capacitor 135 (C9) can be omitted, but is recommended when using an op-amp-based Schmitt trigger. The Schmitt trigger incorporated into the negative-side peak detector 106 may be an active low trigger such that a negative output signal or supply indicates the presence of a positive input signal. A comparator or active-high circuit may be utilized or substituted based on the desired behavior and part selection.

A voltage buffer 138 (U2B) protects and prevents the op-amp 136 (U2C) from interacting with the capacitor 134 (C10). In alternate embodiments, the voltage buffer 138 (U2B) may be removed depending on the precise topology of subsequent circuitry related to the op-amp 136 (U2C). The reference or output associated with the op-amp 136 (U2C) is provided or scaled by the ratio of resistors 133d (R13) and 133e (R14), while the capacitor 140 (C8) provides low-pass filtering. A voltage follower 142 (U2D) buffers or otherwise stores the reference or output associated with the op-amp 136 (U2C). The output of this negative-side peak detector 106, "Detect −", is high (near the positive supply rail) for an active signal present on the negative side (signal below threshold), and low (near the negative supply rail) for an inactive signal on the negative side (signal above threshold).

The combination of "Detect +" and "Detect −" signal allows any subsequent logic circuitry, program or other software to detect the presence of an input signal, and to determine the type of signal being present. Table 1 represents the interpretation of the signals.

TABLE 1

Signal Interpretation

| DETECT+ | DETECT− | INCOMING SIGNAL TYPE |
|---|---|---|
| Inactive | Inactive | No incoming signal |
| Active | Inactive | Incoming positive DC signal |
| Inactive | Active | Incoming negative DC signal |
| Active | Active | Incoming AC signal |

The configuration of the input stage 102 and positive and negative side peak detectors 104 and 106 provides for a DC-coupled circuit that can not only detect an incoming AC signal, but can also differentiate the signal as AC, positive DC, and negative DC. This exemplary configuration and the disclosed teachings may be utilized in applications that require detection of a both an AC and a DC signal alternately present on the same input lines. This configuration may be utilized in connection with the supervised output of a fire alarm amplifier, which uses an AC signal to drive the speakers, and a DC signal for supervision in a standby condition. In other configurations that utilize or require a polarized (distinct positive (+) and negative (−)) wiring layout for an AC signal with DC supervision such as, for example, the amplifiers utilized in the XLSV and MXLV systems provided by SIEMENS BUILDING TECHNOLOGIES of Buffalo Grove, Ill., the exemplary circuit 100 may be utilized to detect wiring with reversed polarity, while maintaining functionality of the overall system. For example, if the supervisory voltage is intended to be +8 VDC, but the exemplary circuit 100 detects a negative DC voltage then a polarity reversal is likely to exist.

Figure 2:
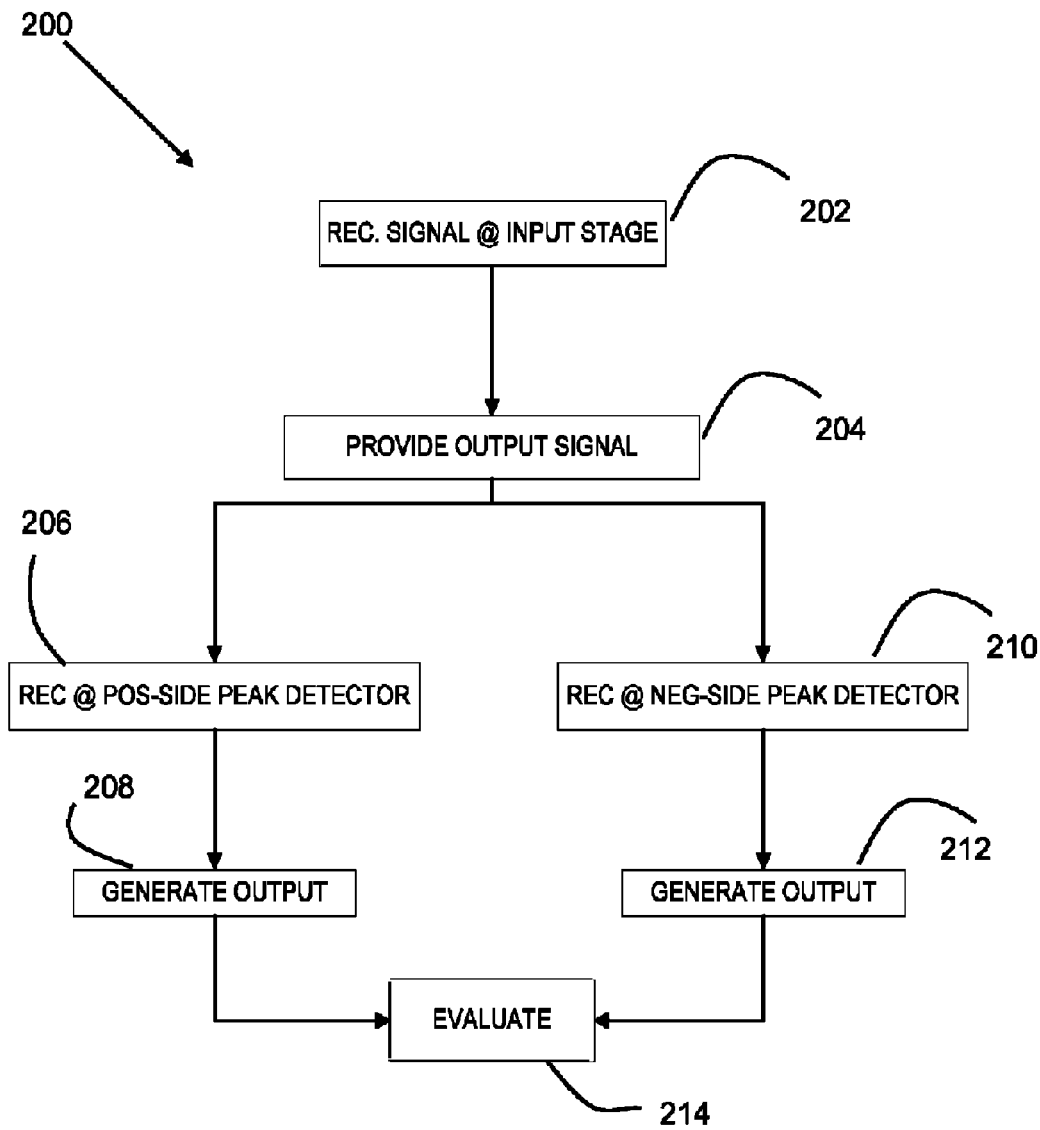
FIG. 2 illustrates a flowchart representative of an exemplary detection and determination process.

FIG. 2 illustrates a flowchart 200 representative of an exemplary detection and determination process. At block 202, a signal representative of a current or voltage change, an alternating current, a positive direct current and/or negative direct current may be received at an input stage or differential receiver. At block 204, an output from the input stage may be provided to a positive-side peak detector and a negative-side peak detector. At block 206, the output is received at a positive-side peak detector. At block 208, the positive-side peak detector provides and output representative of the signal received at the input stage. At block 210, the output is received at a negative-side peak detector. At block 212, the negative-side peak detector provides and output representative of the signal received at the input stage. At block 214, the outputs generated at blocks 208 and 212 is evaluated according to the signal interpretations provided in Table 1.

It should be understood that various changes and modifications to the presently preferred embodiments described herein will be apparent to those skilled in the art. Changes and modification may include, but are not limited to, part or component selection, selection of component values or characteristics, precise arrangement and/or layout, inclusion of a single or dual supply. For example, the exemplary circuit 100 may be utilized in connection with a single supply such that the positive supply remains unchanged, while the negative supply connects to power return (ground), and the ground reference connects to a reference voltage, such as a midrail reference. These changes may be implements to affect or alter the performance of the exemplary circuit 100. Such changes and modifications can be made without departing from the spirit and scope of the present invention and without diminishing its intended advantages. It is therefore intended that such changes and modifications be covered by the appended claims.

What is claimed is:

1. A device for detecting and discriminating a differential current, the device comprising:
    an input stage configured to receive all of an AC current, a positive DC current and a negative DC current, wherein the differential current actually received over a period of time represents one of the AC current, the positive DC current, or the negative DC current;
    a positive-side peak detector in communication with the input stage, wherein the positive-side peak detector is configured to receive an output provided by the input stage, and wherein the positive-side peak detector is configured to create a positive-side peak detector output representative of a positive peak of the current input; and
    a negative-side peak detector in communication with the input stage, wherein the negative-side peak detector is configured to receive the output provided by the input stage, and wherein the negative-side peak detector is configured to create a negative-side peak detector output representative of a negative peak of the current input;
    wherein the positive-side peak detector output and the negative-side peak detector output cooperate to identify the differential current received at the input stage, the cooperation of the positive-side peak detector output and the negative-side peak detector output discriminating the actually received one from the others of the AC current, positive DC current, and negative DC current.

2. The device of claim 1, wherein the input stage is a differential receiver.

3. The device of claim 1, wherein positive-side peak detector comprises a Schmitt trigger.

4. The device of claim 1, wherein negative-side peak detector comprises a Schmitt trigger.

5. The device of claim 1, wherein positive-side peak detector comprises a comparator.

6. The device of claim 1, wherein negative-side peak detector comprises a comparator.

7. The device of claim 1 further comprising a pair of diodes arranged in cooperation with an operational amplifier portion of the input stage.

8. The device of claim 7, wherein the pair of diodes are Zener diodes.

9. A device for detecting and discriminating a time-variable current, the device comprising:
    a differential receiver configured to receive any of an AC current, a positive DC current and a negative DC current, wherein the time-variable current actually receive over a period of time represents one of the AC current, the positive DC current, or the negative DC current;
    a positive-side Schmitt trigger in communication with the input stage, wherein the positive-side Schmitt trigger is configured to receive an output provided by the differential receiver, and wherein the positive-side Schmitt trigger is configured to create a positive-side Schmitt trigger output representative of the current input; and
    a negative-side Schmitt trigger in communication with the input stage, wherein the negative-side Schmitt trigger is configured to receive the output provided by the differential receiver, and wherein the negative-side Schmitt trigger is configured to create a negative-side Schmitt trigger output representative of the current input;

wherein the positive-side Schmitt detector output and the negative-side Schmitt detector output cooperate to identify the time-variable current received at the differential receiver, the cooperation of the positive-side Schmitt detector output and the negative-side Schmitt detector output discriminating the actually received one from the others of the AC current, positive DC current, and negative DC current.

10. The device of claim 9, wherein positive-side Schmitt trigger comprises a comparator.

11. The device of claim 9, wherein negative-side Schmitt trigger comprises a comparator.

12. The device of claim 9 further comprising a pair of diodes arranged in cooperation with an operational amplifier portion of the differential receiver.

13. The device of claim 12, wherein the pair of diodes are Zener diodes.

14. A device for detecting and discriminating a variable current, the device comprising:

a differential receiver configured to receive an AC current, a positive DC current and a negative DC current, wherein the variable current received for a given period of time represents one of the AC current, the positive DC current, or the negative DC current;

a first comparator in communication with the differential received, the first comparator configured to generate a positive-side output in response to an output provided by the differential receiver;

a second comparator in communication with the differential received, the second comparator configured to generate a negative-side output in response to the output provided by the differential receiver;

wherein the outputs of the first and second comparators cooperate to identify the variable current as the one of the AC current, the positive DC current or the negative DC current received at the differential receiver as distinguished from the others of the AC current, the positive DC current and the negative DC current.

15. The device of claim 14, wherein the first comparator is a positive-side Schmitt detector output.

16. The device of claim 14, wherein the second comparator is a negative-side Schmitt detector output.

17. The device of claim 14 further comprising:

a pair of diodes arranged in cooperation with an operational amplifier portion of the differential receiver.

18. The device of claim 17, wherein the pair of diodes are Zener diodes.

* * * * *